US 8,258,986 B2

(12) United States Patent  (10) Patent No.: US 8,258,986 B2
Makovetskyy  (45) Date of Patent: Sep. 4, 2012

(54) CAPACITIVE-MATRIX KEYBOARD WITH MULTIPLE TOUCH DETECTION

(75) Inventor: Mykhailo Makovetskyy, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 981 days.

(21) Appl. No.: 12/217,143

(22) Filed: Jul. 1, 2008

(65) Prior Publication Data

US 2012/0044095 A1   Feb. 23, 2012

Related U.S. Application Data

(60) Provisional application No. 60/947,857, filed on Jul. 3, 2007.

(51) Int. Cl.
  *G06F 3/044* (2006.01)
  *G06F 3/041* (2006.01)
(52) U.S. Cl. ......................... 341/33; 345/173
(58) Field of Classification Search .............. 341/33; 345/173
  See application file for complete search history.

(56) References Cited

U.S. PATENT DOCUMENTS

| | | |
|---|---|---|
| 3,696,908 A | 10/1972 | Gluck et al. |
| 3,750,113 A | 7/1973 | Cencel |
| 4,103,252 A | 7/1978 | Bobick |
| 4,157,539 A | 6/1979 | Hunts et al. |
| 4,163,222 A | 7/1979 | Grove |
| 4,175,239 A | 11/1979 | Sandler |
| 4,235,871 A | 11/1980 | Papahadjopoulos et al. |
| 4,293,734 A | 10/1981 | Pepper, Jr. |
| 4,305,135 A | 12/1981 | Dahl et al. |
| 4,340,777 A | 7/1982 | DeCosta et al. |
| 4,405,917 A | 9/1983 | Chai |
| 4,405,918 A | 9/1983 | Wall et al. |
| 4,495,485 A | 1/1985 | Smith |
| 4,550,221 A | 10/1985 | Mabusth |
| 4,614,937 A | 9/1986 | Poujois |
| 4,727,767 A | 3/1988 | Aiki et al. |
| 4,736,191 A | 4/1988 | Matzke et al. |
| 4,737,768 A | 4/1988 | Lewiner et al. |
| 4,772,874 A | 9/1988 | Hasegawa |
| 4,876,461 A | 10/1989 | Gratke |
| 4,879,508 A | 11/1989 | Andermo |
| 4,954,823 A | 9/1990 | Binstead |
| 5,305,017 A | 4/1994 | Gerpheide |

(Continued)

FOREIGN PATENT DOCUMENTS

EP    0574213 A    12/1993

(Continued)

OTHER PUBLICATIONS

Ryan Seguine, et al., "Layout Guidelines for PSoC™ CapSense™", Cypress Application Note AN2292, Revision B, Oct. 31, 2005, pp. 1-15.

(Continued)

*Primary Examiner* — Jared Fureman
*Assistant Examiner* — Adi Amrany

(57) ABSTRACT

An apparatus and method for detecting activation of one or more capacitive keys when presences of the one or more touches are detected on unique combinations of three or more sensor elements at the respective locations of the capacitive keys on which the one or more touches are detected. In one embodiment, the method correctly detects the activations of multiple keys when multiple substantially simultaneous touches are detected.

11 Claims, 11 Drawing Sheets

U.S. PATENT DOCUMENTS

| | | |
|---|---|---|
| 5,424,756 A | 6/1995 | Ho et al. |
| 5,463,388 A | 10/1995 | Boie et al. |
| 5,499,026 A | 3/1996 | Liao et al. |
| 5,508,700 A | 4/1996 | Taylor et al. |
| 5,543,590 A | 8/1996 | Gillespie et al. |
| 5,543,591 A | 8/1996 | Gillespie et al. |
| 5,565,658 A | 10/1996 | Gerpheide et al. |
| 5,589,856 A | 12/1996 | Stein et al. |
| 5,646,377 A | 7/1997 | Oda |
| 5,648,642 A | 7/1997 | Miller et al. |
| 5,748,185 A | 5/1998 | Stephan et al. |
| 5,825,352 A | 10/1998 | Bisset et al. |
| 5,844,506 A | 12/1998 | Binstead |
| 5,856,822 A | 1/1999 | Du et al. |
| 5,880,411 A | 3/1999 | Gillespie et al. |
| 5,889,236 A | 3/1999 | Gillespie et al. |
| 5,943,052 A | 8/1999 | Allen et al. |
| 5,986,224 A * | 11/1999 | Kent .................... 178/18.04 |
| 6,025,726 A | 2/2000 | Gershenfeld et al. |
| 6,028,271 A | 2/2000 | Gillespie et al. |
| 6,037,929 A | 3/2000 | Ogura et al. |
| 6,067,019 A | 5/2000 | Scott |
| 6,188,391 B1 | 2/2001 | Seely et al. |
| 6,239,389 B1 | 5/2001 | Allen et al. |
| 6,262,717 B1 | 7/2001 | Donohue et al. |
| 6,380,931 B1 | 4/2002 | Gillespie et al. |
| 6,414,671 B1 | 7/2002 | Gillespie et al. |
| 6,424,338 B1 | 7/2002 | Anderson |
| 6,429,857 B1 | 8/2002 | Masters et al. |
| 6,452,514 B1 | 9/2002 | Philipp |
| 6,473,069 B1 | 10/2002 | Gerpheide |
| 6,498,720 B2 | 12/2002 | Glad |
| 6,504,530 B1 | 1/2003 | Wilson et al. |
| 6,574,095 B2 | 6/2003 | Suzuki |
| 6,597,347 B1 * | 7/2003 | Yasutake .................... 345/173 |
| 6,610,936 B2 | 8/2003 | Gillespie et al. |
| 6,704,005 B2 | 3/2004 | Kato et al. |
| 6,750,852 B2 | 6/2004 | Gillespie et al. |
| 6,762,752 B2 | 7/2004 | Perski et al. |
| 6,825,890 B2 | 11/2004 | Matsufusa |
| 6,861,961 B2 | 3/2005 | Sandbach et al. |
| 6,947,031 B2 | 9/2005 | Sandbach et al. |
| 6,970,160 B2 | 11/2005 | Mulligan et al. |
| 6,992,601 B2 * | 1/2006 | Chiu et al. .................... 341/22 |
| 7,006,078 B2 | 2/2006 | Kim |
| 7,030,860 B1 | 4/2006 | Hsu et al. |
| 7,046,230 B2 | 5/2006 | Zadesky et al. |
| 7,109,978 B2 | 9/2006 | Gillespie et al. |
| 7,129,935 B2 | 10/2006 | Mackey |
| 7,151,276 B2 | 12/2006 | Gerlach et al. |
| 7,202,855 B2 | 4/2007 | Shigetaka et al. |
| 7,202,859 B1 | 4/2007 | Speck et al. |
| 7,239,302 B2 | 7/2007 | Kim |
| 7,253,643 B1 | 8/2007 | Seguine |
| 7,288,946 B2 | 10/2007 | Hargreaves et al. |
| 7,301,350 B2 | 11/2007 | Hargreaves et al. |
| 7,301,351 B2 | 11/2007 | Deangelis et al. |
| 7,327,352 B2 | 2/2008 | Keefer et al. |
| 7,362,244 B2 | 4/2008 | Sun |
| 7,362,313 B2 | 4/2008 | Geaghan et al. |
| 7,423,635 B2 | 9/2008 | Taylor et al. |
| 7,439,962 B2 | 10/2008 | Reynolds et al. |
| 7,446,300 B2 | 11/2008 | Silvestre |
| 7,450,113 B2 | 11/2008 | Gillespie et al. |
| 7,466,307 B2 | 12/2008 | Trent et al. |
| 7,479,949 B2 | 1/2009 | Jobs et al. |
| 7,532,205 B2 | 5/2009 | Gillespie et al. |
| 7,539,513 B2 | 5/2009 | Cathey et al. |
| 7,863,582 B2 | 12/2009 | Finley et al. |
| 7,656,392 B2 | 2/2010 | Bolender |
| 7,663,607 B2 | 2/2010 | Hotelling et al. |
| 7,710,397 B2 | 5/2010 | Krah et al. |
| 7,719,522 B2 | 5/2010 | Lyon et al. |
| 7,728,377 B2 | 6/2010 | Elsass et al. |
| 8,059,015 B2 | 11/2011 | Hua et al. |
| 2003/0011576 A1 | 1/2003 | Sandbach et al. |
| 2003/0064326 A1 | 4/2003 | Yamamoto et al. |
| 2004/0017355 A1 | 1/2004 | Shim |
| 2004/0140993 A1 | 7/2004 | Geaghan et al. |
| 2004/0252109 A1 | 12/2004 | Trent et al. |
| 2005/0023145 A1 | 2/2005 | Cohen et al. |
| 2005/0231487 A1 | 10/2005 | Ming |
| 2006/0026521 A1 | 2/2006 | Hotelling et al. |
| 2006/0026536 A1 | 2/2006 | Hotelling et al. |
| 2006/0032680 A1 | 2/2006 | Elias et al. |
| 2006/0066582 A1 | 3/2006 | Lyon et al. |
| 2006/0091301 A1 * | 5/2006 | Trisnadi et al. .................... 250/226 |
| 2006/0097991 A1 | 5/2006 | Hotelling et al. |
| 2006/0192690 A1 | 8/2006 | Philipp |
| 2006/0197752 A1 | 9/2006 | Hurst et al. |
| 2006/0197753 A1 | 9/2006 | Hotelling et al. |
| 2007/0008299 A1 | 1/2007 | Hristov |
| 2007/0046299 A1 | 3/2007 | Hargreaves et al. |
| 2007/0063876 A1 | 3/2007 | Wong |
| 2007/0074913 A1 | 4/2007 | Geaghan et al. |
| 2007/0132737 A1 | 6/2007 | Mulligan et al. |
| 2007/0177803 A1 | 8/2007 | Elias et al. |
| 2007/0229466 A1 | 10/2007 | Peng et al. |
| 2007/0229468 A1 | 10/2007 | Peng et al. |
| 2007/0229469 A1 | 10/2007 | Seguine |
| 2007/0229470 A1 | 10/2007 | Snyder et al. |
| 2007/0236475 A1 | 10/2007 | Wherry |
| 2007/0236618 A1 | 10/2007 | Maag et al. |
| 2007/0247431 A1 | 10/2007 | Skillman et al. |
| 2007/0262962 A1 | 11/2007 | Xiaoping et al. |
| 2008/0007434 A1 | 1/2008 | Hristov |
| 2008/0041640 A1 | 2/2008 | Gillespie et al. |
| 2008/0042994 A1 | 2/2008 | Gillespie et al. |
| 2008/0048997 A1 | 2/2008 | Gillespie et al. |
| 2008/0084400 A1 | 4/2008 | Rosenberg |
| 2008/0088602 A1 | 4/2008 | Hotelling |
| 2008/0122796 A1 | 5/2008 | Jobs et al. |
| 2008/0150906 A1 | 6/2008 | Grivna |
| 2008/0165132 A1 | 7/2008 | Weiss et al. |
| 2008/0165140 A1 | 7/2008 | Christie et al. |
| 2008/0165141 A1 | 7/2008 | Christie et al. |
| 2008/0165255 A1 | 7/2008 | Christie et al. |
| 2008/0192005 A1 | 8/2008 | Elgoyhen et al. |
| 2008/0204426 A1 | 8/2008 | Hotelling et al. |
| 2008/0264699 A1 | 10/2008 | Chang et al. |
| 2008/0278178 A1 | 11/2008 | Philipp |
| 2009/0284478 A1 | 11/2009 | De La et al. |
| 2010/0019780 A1 * | 1/2010 | Bulea .................... 324/662 |
| 2010/0066701 A1 * | 3/2010 | Ningrat .................... 345/174 |

FOREIGN PATENT DOCUMENTS

| | | |
|---|---|---|
| WO | 0002188 A | 1/2000 |

OTHER PUBLICATIONS

Dennis Seguine, "Capacitive Switch Scan", Cypress Application Note AN2233a, Revision B, Apr. 14, 2005, pp. 1-6.

Dave Van Ess, "Understanding Switched Capacitor Analog Blocks", Cypress Application Note AN2041, Revision B, Mar. 30, 2004, pp. 1-1.

Mark Lee, "CapSense Best Practices", Cypress Application Note AN2394, Rev.**, Oct. 19, 2006, pp. 1-10.

Mark Lee, "The Art of Capacitive Touch Sensing", Cypress Perform, Published in Embedded.com (http://www.embedded.com.

CSR User Module Data Sheet, CSR v1.0, CY8C21x34 Data Sheet, Oct. 6, 2006, pp. 1-36.

CSD User Module Data Sheet, CSD v1.0, Oct. 23, 2006, pp. 1-58.

Michael Macovetskyi et al., "Capacitance Sensing—PC-Compatible USB CapSense Matrix Keyboard", AN2407, Feb. 16, 2007, pp. 1-8.

Quantum Research Group, QT60326, QT60486, 32 & 48 Key QMatrix™ ICs, 2003-2005 ORG Ltd, QT60486-AS R8.01/0105, 32 pages.

U.S. Appl No. 13/297,046 "Capacitance Sensing Matrix for Keyboard Architecture", filed Nov. 15, 2011, 72 pages.

USPTO Non-Final Rejection, U.S. Appl. No. 11/440,924 dated Mar. 10, 2009, 23 pages.

Uspto Notice of Allowance, U.S. Appl. No. 11/440,924 dated Sep. 23, 2009, 11 pages.

USPTO Non-Final Rejection, U.S. Appl. No. 11/440,924 dated Jan. 20, 2010, 21 pages.

USPTO Notice of Allowance, U.S. Appl. No. 11/440,924 dated Jul. 9, 2010, 8 pages.
USPTO Non-Final Rejection, U.S. Appl. No. 11/440,924 dated Jun. 10, 2011, 25 pages.
USPTO Non-Final Rejection, U.S. Appl. No. 11/440,924 dated Sep. 1, 2011, 9 pages.
"CSD User Module Data Sheet," CSD v1.0, Oct 23, 2006; 58 pages.
"CY8C21x34 Data Sheet," CSR User Module (CSR v1.0), Cypress Semiconductor Corp., Oct. 6, 2005, pp. 1-36.
"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006; 4 pages.
Chapweske, Adam; "The PS/2 Mouse Interface," PS/2 Mouse Interfacing, 2001, retrieved on May 18, 2006; 11 pages.
Chris Mack, "Semiconductor Lithography—The Basic Process," Gentleman Scientist, downloaded Apr. 20, 2006, http://www.lithoguru.com/scientist/lithobasics.html; 12 pages.
Dave Van Ess, "Understanding Switched Capcitor Analog Blocks", Cypress Application Note AN2041, Revision B, Mar. 30, 2004, pp. 1-16.
Dennis Seguine, "Capacitive Switch Scan," Cypress Semiconductor Application Note, Apr. 14, 2005; 6 pages.
Mark Lee, "CapSense Best Practices", Cypress Application Note AN2394, Rev.\*\*, Oct. 19, 2006, pp. 1-10.
Mark Lee, "The Art of Capacitive Touch Sensing", Cypress Perform, Published in Embedded.com, (www.embedded.com).
Wayne Westerman, "Hand Tracking, Finger Identification, and Chordic Manipulation on a Multi-Touch Surface", Spring 1999, pp. i-xxx and 1-333.
Robert Jania, "Cypress CapSense Successive Approximation Algorithm", White Paper CSA RJO.doc, Jan. 17, 2007, pp. 1-6.
Ryan Seguine et al, "Layout Guidelines for PSoC CapSense", Cypress Application Note AN2292, Revision B, Oct. 31, 2005, pp. 1-15.
USPTO Advisory Action for U.S. Appl. No. 11/605,506 dated Apr. 12, 2010; 3 pages.
USPTO Final Rejection for U.S. Appl. No. 11/395,674 dated Jul. 16, 2009; 12 pages.
USPTO Final Rejection for U.S. Appl. No. 11/432,130 dated Jul. 19, 2010; 15 pages.
USPTO Final Rejection for U.S. Appl. No. 11/432,130 dated Nov. 30, 2009; 15 pages.
USPTO Final Rejection for U.S. Appl. No. 11/605,506 dated Feb. 3, 2010; 14 pages.
USPTO Final Rejection for U.S. Appl. No. 11/605,819 dated Feb. 2, 2010; 15 pages.
USPTO Non-Final Rejection for U.S. Appl. No. 11/395,674 dated Feb. 10, 2009; 10 pages.
USPTO Non-Final Rejection for U.S. Appl. No. 11/395,674 dated Apr. 19, 2010; 15 pages.
USPTO Non-Final Rejection for U.S. Appl. No. 11/395,674 dated Aug. 27, 2010; 15 pages.
USPTO Non-Final Rejection for U.S. Appl. No. 11/395,674 dated Nov. 18, 2009; 11 pages.
USPTO Non-Final Rejection for U.S. Appl. No. 11/396,179 dated Mar. 19, 2009; 25 pages.
USPTO Non-Final Rejection for U.S. Appl. No. 11/432,130 dated Mar. 24, 2010; 15 pages.
USPTO Non-Final Rejection for U.S. Appl. No. 11/432,130 dated Jun. 9, 2009; 14 pages.
USPTO Non-Final Rejection for U.S. Appl. No. 11/605,506 dated Aug. 11, 2009; 11 pages.
USPTO Non-Final Rejection for U.S. Appl. No. 11/605,819 dated Aug. 11, 2009; 12 pages.
USPTO Notice of Allowance for U.S. Appl. No. 11/396,179 dated May 20, 2010; 11 pages.
USPTO Notice of Allowance for U.S. Appl. No. 11/396,179 dated Oct. 8, 2009; 7 pages.
USPTO Requirement for Restriction/Election for U.S. Appl. No. 11/396,179 dated Feb. 3, 2009; 6 pages.
USPTO Requirement for Restriction/Election for U.S. Appl. No. 11/432,130 dated Mar. 31, 2009; 6 pages.
USPTO Non-Final Rejection for U.S. Appl. No. 13/297,046 dated Jun. 12, 2012; 7 pages.

\* cited by examiner

CAPACITIVE-MATRIX KEYBOARD WITH MULTIPLE TOUCH DETECTION

RELATED APPLICATIONS

This application claims the benefit of U.S. Provisional Patent Application No. 60/947,857, filed Jul. 3, 2007, the entire contents of which are hereby incorporated by reference herein.

TECHNICAL FIELD

This invention relates to the field of user interface devices and, in particular, to touch-sensor devices.

BACKGROUND

Computing devices, such as notebook computers, personal data assistants (PDAs), and mobile handsets, have user interface devices, which are also known as human interface devices (HID). One type of user interface devices that has become more common is touch-sensor devices, such as touch-sensor pads (also commonly referred to as touchpads), touch-sensor sliders, touch-sensor buttons, and touch-sensor keyboard. One type of touch-sensor keyboard is a capacitive sensor keyboard. Conventional touch-sensor keyboards are widely used in modern compact devices. In some conventional touch-sensor keyboards, the keyboard sensors can be connected individually to pins of a microcontroller. In other conventional keyboards, the keyboard sensors can be connected in a keyboard matrix, much like a mechanical keyboard matrix of switches at intersecting rows and columns. The keyboard keys are organized into rows and columns, such as illustrated in FIG. 1A.

FIG. 1A illustrates a conventional touch-sensor keyboard matrix 100. The conventional keyboard matrix 100 includes three rows ($ROW_{1-3}$) 101 and three columns ($COL_{1-3}$) 102 of capacitive keys. Each capacitive key has two segments, each segment having two sensor elements. The sensor elements opposite each other are connected to each other, creating two interwoven, yet electrically distinct, sensors for each capacitive key; there is one row sensor (hashed lines) and column sensor (white) for each capacitive key. The interwoven key structure means that a key represents activation on a row and a column at the same time. The microcontroller performs activation detection of the keys by performing an analysis of the intersections of the rows and columns. The microcontroller detects activation of a key when the row and column segment intersection has been activated, meaning both the particular row and column of sensors detect the touch. This method works well when only one key (one row and one column) is pressed at a time. If more than one key is pressed, false activations (e.g., invalid activations) can occur due to multiple row-column intersection activations.

FIG. 1B illustrates multiple activation scenarios on a conventional touch-sensor keyboard matrix. The first activation scenario a) for a single pressed key (illustrated with a shaded circle surrounding the pressed key). As described above, the conventional keyboard matrix works well when only one key (e.g., $Key_3$) is pressed at a time. In some cases, the microcontroller can detect a simultaneous-key press, as illustrated in the second activation scenario b) for two pressed keys (e.g., $Key_3$ and $Key_4$) (illustrated with shaded circles surrounding the pressed keys). In this scenario, because both pressed keys are detected in the same row (e.g., $ROW_2$) but different columns (e.g., $COL_1$ and $COL_2$), the microcontroller can distinguish the activation state. Although in some cases the microcontroller can distinguish the activation state, simultaneous-key presses can only be detected in a limited number of scenarios. For example, the third and fourth activation scenarios c) and d) illustrate different simultaneous-key presses that exhibit the same activation state and cannot be distinguished. In these scenarios, because the two pressed keys are detected in different rows and different columns, the microcontroller cannot distinguish the activation state in either scenario. In the third scenario c), only the two keys, $Key_2$ and $Key_3$, should have been activated, but instead, the microcontroller incorrectly detects activations of all four keys, $Keys_{1-4}$, as false or invalid activations. Scenarios in which two or more touched keys do not share either a row or column sensor, when pressed, result in false activations.

To avoid this phenomenon, conventional keyboard design logic has been restricted to allow only one key to register as pressed by selecting only one row and column sensor at a time. The selected sensor may be determined by a sorting algorithm for signals. In another conventional keyboard design, complex timing algorithms are used to distinguish a simultaneous-key press. These conventional keyboard designs require complicated logic to determine which keys have been pressed and to distinguish the activation state for a simultaneous-key press.

BRIEF DESCRIPTION OF THE DRAWINGS

The present invention is illustrated by way of example, and not by way of limitation, in the figures of the accompanying drawings.

DETAILED DESCRIPTION

Figure 1A:
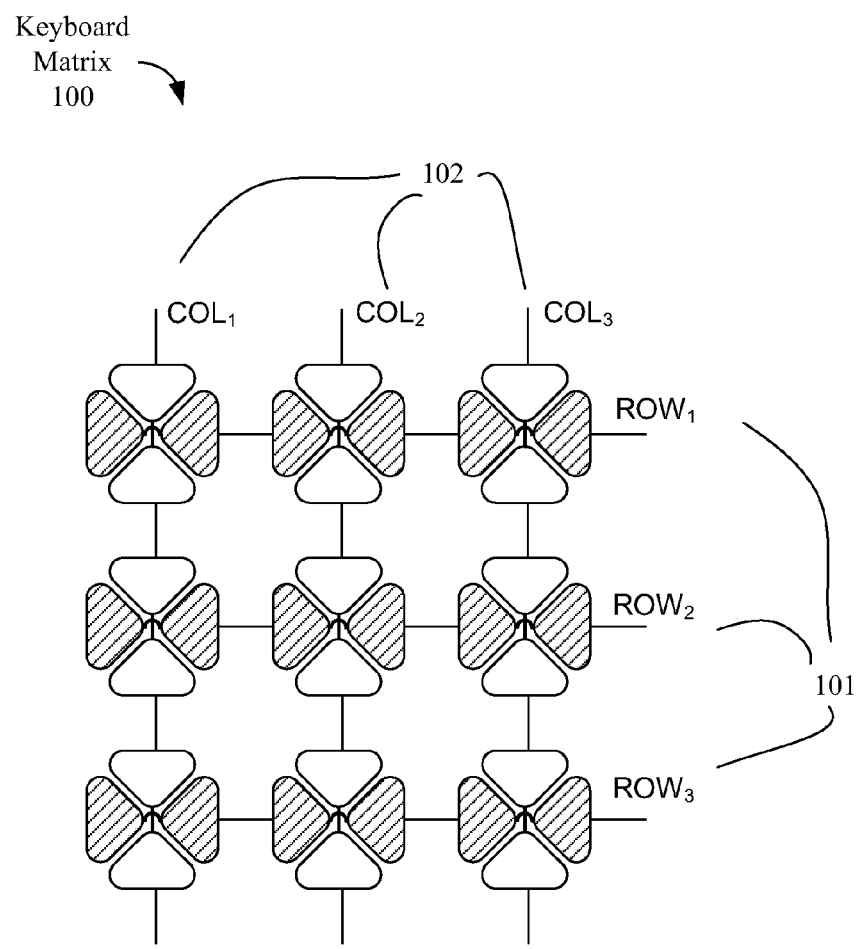
FIG. 1A illustrates a conventional keyboard matrix.

Described herein is an apparatus and method for detecting activation of one or more capacitive keys when presences of the one or more touches are detected on unique combinations of three or more sensor elements at the respective locations of the capacitive keys on which the one or more touches are detected. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Unlike the conventional capacitive keys that only include two electrically independent group segments, namely the row segment and the column segment, the embodiments described herein add a third electrically independent group segment to each of the capacitive keys. In one embodiment, each capacitive key includes three group segments, namely the row segment, the column segment, and an additional diagonal segment. In another embodiment, each capacitive key includes more than three separate group segments. Using the three group segments, the embodiments described herein can detect multiple touches without false activations (also referred to as false touch key detection), as described above with respect to the conventional keyboard matrix. Using three or more group segments (e.g., row, column, and diagonal segments), the embodiments described herein can correctly detect one or more touches (such as substantially simultaneous touches) when one or more fingers are located on one or more capacitive keys. This structure is useful because, when one finger is located on the capacitive key, the row, column, and diagonal segments of the capacitive key are touched at the same time, and the touch on the capacitive key can be correctly detected. Similarly, using the same structure, when two or more fingers are located on multiple capacitive keys, the row, column, and diagonal segments of each of the capacitive keys are touched at the same time, and the multiple touches on the capacitive key can be correctly detected. Also, unlike the conventional matrix, the embodiments described herein can distinguish between activations states, eliminating false activations that typically occur when substantially simultaneous touches occur on the capacitive-matrix keyboard.

One or more touches may be detected by analyzing the row, column, and diagonal segment intersections. Each intersection represents a unique combination of segments of three or more groups. The embodiments of the capacitive-matrix keyboard with three group segments can be represented as a 3D array with unique key combinations in each row-column two-dimensional array. If any diagonal line is activated the search algorithm analyzes the row and column lines to find the touched keys. The key is considered to be "touched," when the row and column lines are activated in the same time frame (e.g., scanning cycle). The proposed embodiments of the capacitive-matrix keyboard with multi-touch detection capability allow the capacitive-matrix keyboard to be implemented in a multi-touch user interface device, increasing the device's usefulness. The embodiments described herein also eliminate false (e.g., invalid) activations when touch several keys are touched at the same time. The embodiments described herein also may simplify the mechanical keyboard design by placement of capacitive keys in an optimal configuration for layout purposes.

It should be noted that although in some embodiments the capacitive keys are described as being "touched" or "pressed," the sensor elements of the capacitive keys may not actually be pressed or touched, but rather, the processing device 210 detects the presence of a conductive object that is in close proximity to the sensor. As would be understood by one of ordinary skill in the art, most capacitive sensors have an overlay disposed above the conductive material of the sensor to protect the sensor from the user actually touching the sensor. As such, the presence of the conductive object is detected as being in close proximity to the capacitive sensor, such as when the conductive object approaches or touches the overlay disposed above the capacitance sensor. The conductive object can be, for example, a stylus or a user's finger. In a touch-sensor device, a change in capacitance detected by each sensor, due to the proximity or movement of a conductive object can be measured by a variety of methods. Regardless of the method, usually an electrical signal representative of the capacitance detected by each capacitive sensor is processed by a processing device, which in turn produces electrical or optical signals representative of the activation of a particular capacitive key as being pressed.

Figure 2:
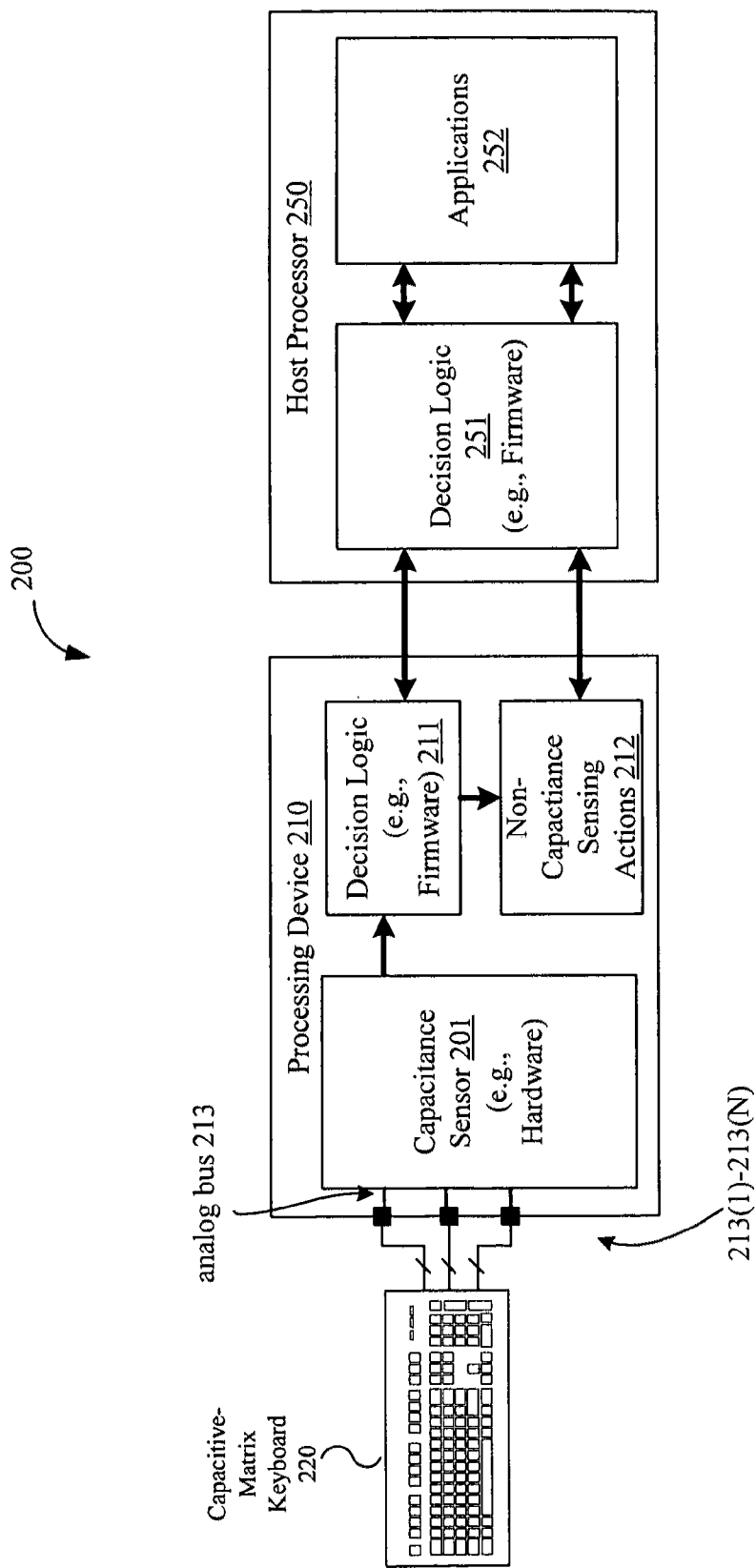
FIG. 2 illustrates a block diagram of one embodiment of an electronic system having a processing device for detecting a presence of a conductive object.

FIG. 2 illustrates a block diagram of one embodiment of an electronic system having a processing device for detecting a presence of a conductive object. Electronic system 200 includes a processing device 210, a capacitive-matrix keyboard 220, and a host 250, each of which are described in more detail below.

In the depicted embodiment, the processing device 210 includes a capacitance sensor 201, decision logic 211, and non-capacitance sensing actions 212. The processing device 210 may be configured to detect a presence of a conductive object on the capacitive-matrix keyboard 220 (e.g., touch-sensor device) having multiple capacitive keys at respective locations on the capacitive-matrix keyboard 220. Each of the capacitive keys includes a unique combination of three or more sensor elements from three or more separate groups of one or more sensor elements. For example, there may be three separate groups of sensor elements, a first group of row sensor elements, a second group of column sensor elements, and a third group of diagonal sensor elements. The processing device 210 may be configured to detect activation of a capacitive key of the keyboard when the presence of the conductive object is detected on the unique combination of three or more sensor elements corresponding to the first capacitive key.

In another embodiment, the processing device 210 detects presences of multiple substantially simultaneous touches on the capacitive-matrix keyboard, and detects multiple activations of multiple keys when the presence of the multiple substantially simultaneous touches are detected on the unique combinations of three or more sensor elements at the respective locations of the capacitive keys on which the multiple substantially simultaneous touches are detected.

As illustrated, the capacitance sensor 201 may be integrated into the processing device 210. Alternatively, the capacitance sensor 201 may be implemented separately from the other components of the processing device 210. The capacitance sensor 201 may include analog I/O pins 213(1)-(N) for coupling to an external component, such as the capacitance-matrix keyboard, and/or other devices. The capacitive-matrix keyboard 220 includes multiple groups of one or more sensor elements, each row, column, or diagonal of the respective groups are coupled to the pins 213(1)-(N) of the processing device 210, where N is a positive integer value that represents the total number of rows, columns, and diagonals of the capacitive-matrix keyboard 220.

The processing device 210 may also be coupled to other touch-sensor devices, such as a touch-sensor pad, a touch-sensor slider, and a touch panel having one or more touch-sensor buttons. Alternatively, the processing device 210 may be coupled to other non-capacitance sensor elements, such as mechanical buttons, light emitting diodes (LEDs), and other user interface devices, such as a mouse, a keyboard, a display, or other functional keys that do not use capacitance sensing. The processing device 210 may also provide value-added functionality such as keyboard control integration, LEDs, battery charger, and general-purpose I/O, as non-capacitance sensor elements.

In one embodiment, the capacitance sensor 201 is a capacitive sense relaxation oscillator (CSR). The CSR may include a current-programmable relaxation oscillator, an analog multiplexer, digital counting functions, and high-level software routines to compensate for environmental and physical sensor element variations. Alternatively, the capacitance sensor may use other methods for measuring capacitance other than CSR, such as current versus voltage phase shift measurement, resistor-capacitor charge timing, capacitive bridge divider, charge transfer, sigrna-delta modulators, charge-accumulation circuits, or the like. Some of these methods are briefly described below, however, additional details regarding the circuit configurations and functionality has not been included so as to not obscure the discussion of the present embodiments.

The current versus voltage phase shift measurement may include driving the capacitance through a fixed-value resistor to yield voltage and current waveforms that are out of phase by a predictable amount. The drive frequency can be adjusted to keep the phase measurement in a readily measured range. The resistor-capacitor charge timing may include charging the capacitor through a fixed resistor and measuring timing on the voltage ramp. Small capacitance values may require very large resistors for reasonable timing. The capacitive bridge divider may include driving the capacitor under test through a fixed reference capacitor. The reference capacitor and the capacitor under test form a voltage divider. The voltage signal may be recovered with a synchronous demodulator, which may be done in the processing device 210. The charge transfer may be conceptually similar to an R-C charging circuit. In this method, $C_P$ is the capacitance being sensed. $C_{SUM}$ is the summing capacitor, into which charge is transferred on successive cycles. At the start of the measurement cycle, the voltage on $C_{SUM}$ is discharged. The voltage on $C_{SUM}$ increases exponentially (and only slightly) with each clock cycle. The time for this voltage to reach a specific threshold is measured with a counter.

In one embodiment, the capacitance sensor 201 includes a selection circuit (not illustrated). The selection circuit is coupled to the sensor elements of the capacitive-matrix keyboard 220 and the sensing circuitry of the capacitance sensor 201. The selection circuit may be used to allow the capacitance sensor 201 to measure capacitance on multiple sensor elements of an axis (e.g., row, column, or diagonal). The selection circuit may be configured to sequentially select rows, columns, or diagonals of sensor elements of each axis to provide the charge current and to measure the capacitance on the selected row, column, or diagonal. Alternatively, the selection circuit may be configured to select sensor elements in other configurations. In one exemplary embodiment, the selection circuit is a multiplexer array. Alternatively, the selection circuit may be other circuitry inside or outside the capacitance sensor 201 to select the one or more sensor elements to be measured. The selection circuit may also be used to connect the sensor elements that are not being measured to the system ground.

It should be noted that although one capacitance sensor 201 has been described and illustrated, in other embodiments, more than one capacitance sensor 201 may be used, for example, separate capacitance sensors may be used to measure each of the groups separately, such as a first capacitance sensor to measure the rows, a second capacitance sensor to measure the columns, and a third capacitance sensor to measure the diagonals. In another embodiment, the capacitance sensor 201 is configured to simultaneously sense the set of sensor elements, as opposed to being configured to sequentially scan the set of sensor elements as described above. For example, the sensing device may include a sensor array having multiple axes of sensor elements in rows, columns, or other non-orthogonal directions. Each axis may be sensed simultaneously or independent of the others.

The processing device 210 may include analog and/or digital general-purpose input/output ("GPIO") ports, in addition to the capacitance sensing pins 213(1)-213(N). The processing block 210 may have configurable user modules, including digital block arrays, which can be configured to implement a variety of digital logic circuits (e.g., digital-to-analog converter (DAC), digital filters, digital control systems, or the like). The processing device 210 may also include memory, such as random access memory (RAM), and program flash (e.g., non-volatile memory), other types of memory and/or storage. The program flash may be used to store firmware (e.g., control algorithms executable by a processing core of the processing device to implement the operations described herein). Processing device 210 may also include a memory controller unit (MCU) coupled to memory and the processing core.

The processing device 210 may include internal oscillator/clocks to provide clock signals to one or more of the components of processing device 210. The processing device 210 may also include a communication block to communicate with an external component, such as the host 250, such as via host interface (I/F). Alternatively, the processing block 210 may be coupled to an embedded controller to communicate with the external components, such as the host 250. The processing device 210 communicates with the embedded controller and/or the host 250 to send and/or receive data. The data may be a command or alternatively a signal. Interfacing to the host 250 can be through various methods. In one exemplary embodiment, interfacing with the host 250 is done using a standard PS/2 interface to connect to an embedded controller, which in turn sends data to the host 250 via a low pin count (LPC) interface. In another exemplary embodiment, interfacing is done using a universal serial bus (USB) interface directly coupled to the host 250. Alternatively, the processing device 210 may communicate to external components, such as the host 250 using industry standard interfaces, such as USB, PS/2, inter-integrated circuit (I2C) bus, or system packet interfaces (SPI). The host 250 and/or embedded controller may be coupled to the processing device 210 with a ribbon or flex cable from an assembly, which houses the sensing device and processing device.

In the depicted embodiment, the processing device 210 further includes a decision logic block 211. The operations of decision logic block 211 may be implemented in firmware; alternatively, it may be implemented in hardware, software, or any combination thereof. The decision logic block 211 may be configured to receive the digital code or counts, which represent the measured capacitance, from the capacitance sensor 201, and to determine the state of the capacitive-matrix keyboard 220, such as whether a conductive object is detected on the capacitive-matrix keyboard 220, and/or whether one or more capacitive keys have been activated. The decision logic 211 may also be configured to determine the location of where the conductive object was detected on the capacitive-matrix keyboard 220 (e.g., determining the X-, Y-coordinates of the presence of the conductive object), to determine absolute or relative position of the conductive object, whether the conductive object is performing a pointer operation, whether a gesture has been recognized on the capacitive-matrix keyboard 220 (e.g., click, double-click, movement of the pointer, scroll-up, scroll-down, scroll-left, scroll-right, step Back, step Forward, tap, push, hop, zigzag gestures, or the like), or the like.

In another embodiment, instead of performing the operations of the decision logic 211 in the processing device 210, the processing device 201 sends the raw data to the host 250, as described above. The host 250, as illustrated in FIG. 2, may include the decision logic 251. The operations of the decision logic 251 may also be implemented in firmware, hardware, and/or software. Also, as described above, the host 250 may include high-level APIs in applications 252 that perform routines on the received data, such as compensating for sensitivity differences, other compensation algorithms, baseline update routines, start-up and/or initialization routines, interpolations operations, scaling operations, or the like. The operations described with respect to the decision logic 211 may be implemented in decision logic 251, applications 252, or in other hardware, software, and/or firmware external to the processing device 210.

In another embodiment, the processing device 210 also includes a non-capacitance sensing actions block 212. This block may be used to process and/or receive/transmit data to and from the host 250. For example, additional components may be implemented to operate with the processing device 210 along with the capacitive-matrix keyboard 220 (e.g., keypad, mouse, trackball, LEDs, displays, buttons, or the like).

The processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 is the Programmable System on a Chip (PSoC®) device, manufactured by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device is a network processor having multiple processors including a core unit and multiple microengines. Additionally, the processing device may include any combination of general-purpose processing device(s) and special-purpose processing device(s).

It should be noted that the components of electronic system 200 may include all the components described above. Alternatively, electronic system 200 may include only some of the components described above, or include additional components not listed herein.

Figure 3A:
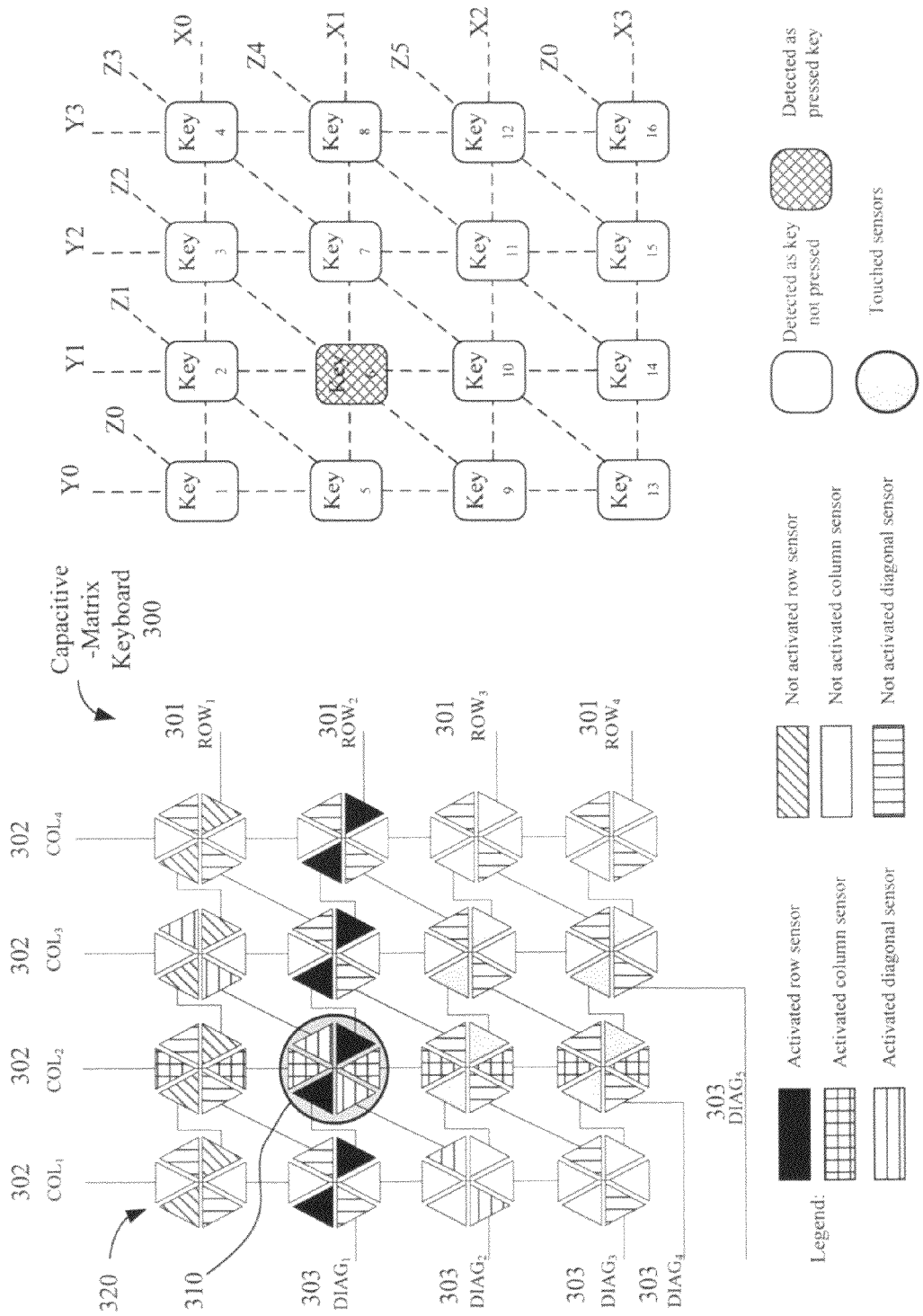
FIG. 3A illustrates an activation scenario of a single touch on a capacitive-matrix keyboard according to one embodiment.

FIG. 3A illustrates an activation scenario of a single touch 310 on a capacitive-matrix keyboard 300 according to one embodiment. The capacitive-matrix keyboard 300 includes four rows includes four rows ($ROW_{1-4}$) 301, four columns ($COL_{1-4}$) 302, and five diagonals ($DIAG_{1-5}$) 303 of capacitive keys 320. Each capacitive key 320 has three segments, each segment having two triangle-shaped sensor elements. In the depicted embodiment, the three segments are a row segment, a column segment, and a diagonal segment. The six sensor elements of the row, column, and diagonal segments of each capacitive key 320 collectively form a substantially hexagon shape.

In the depicted embodiment, the sensor elements opposite each other are connected to each other, creating two interwoven, yet electrically distinct, sensor for each capacitive key 320; there is one row sensor (vertical and horizontal lines), one column sensor (white), and one diagonal sensor (vertical lines) for each capacitive key 320. The interwoven key structure means that a capacitive key 320 represents activation on a row, a column, and a diagonal at the same time. All sensor elements in each row 301 are coupled together using interconnecting traces. Similarly, all sensor elements in each column 302, and each diagonal 303 are coupled together using interconnecting traces. Each capacitive key 320 includes a unique combination of sensor elements from the rows 301, columns 302, and diagonals 303. For example, the single touch 310 (indicated by the gray-shaded circle surrounding the capacitive key 320) activates the sixth key ($Key_6$) when the presence of a conductive object is detected on the second row ($ROW_2$) 301, the second column ($COL_2$), and the second diagonal ($DIAG_2$), which represents the unique combination corresponding to the sixth key ($Key_6$).

Each of the four rows ($ROW_{1-4}$) 301, four columns ($COL_{1-4}$) 302, and five diagonals ($DIAG_{1-5}$) 303 is separately coupled to the separate pins 213 of the processing device 210. In this embodiment, there are 13 sensing lines that connect the four rows 301, the four columns 302, and the five diagonals 303 to 13 pins of the processing device. In other embodiments, the number of sensing-lines depends on the number of rows 301, columns 302, and diagonals 303 used. Also, more diagonals 303 may be used, for example, to connect the sensor elements of the top-left capacitive key 320, and the bottom-left capacitive key 320. In another embodiment, the number of sensing lines may be determined by the following formula $2*M+2*N-3$, where N is the number of rows and M is the number of columns. In another embodiment, due to the locations of the top-right and bottom-left capacitive key 320, a sensing line can be coupled to both, and the activation of these buttons may be determined based on the activation determination of the rows 301 and columns 302. Alternatively, less than five sensing lines may be used for the diagonals by connecting partial diagonals to other partial diagonals. For example, the sensor elements of the top-left capacitive key can be coupled to the fourth diagonal ($DIAG_4$) sensing line, the first diagonal ($DIAG_1$) can be coupled to the sensor elements of the fifth diagonal ($DIAG_5$), and the sensor elements of the bottom-right capacitive key can be coupled to the second ($DIAG_2$), such that the diagonals are connected as virtual cylinders, to reduce the total number of sensing signals from the capacitive-matrix keyboard 300. Other routing configurations are possible.

The processing device 210, as described herein, performs activation detection of the capacitive keys by performing an analysis of the intersections of the rows 301, columns 302, and diagonals 303. As described above, in the depicted scenario, the single touch 310 is detected when the conductive object (e.g., finger, stylus, etc) is detected when the presence of a conductive object is detected on the second row ($ROW_2$) 301, the second column ($COL_2$), and the second diagonal ($DIAG_2$). More specifically, as illustrated in FIG. 3A, since the single touch 310 is detected on the second row ($ROW_2$) 301, each sensor (e.g., two opposing triangle-shaped sensor elements) in that row 301 is activated (indicated as solid black sensors), as opposed to the row sensors that are not activated (indicated as sensors having hashed lines). Also, each sensor (e.g., two opposing triangle-shaped sensor elements) in the second column 302 is activated (indicated as sensors having vertical and horizontal lines), as opposed to the column sensors that are not activated (indicated as solid white sensors). Similarly, each sensor (e.g., two opposing triangle-shaped sensor elements) in the first diagonal 303 is activated (indicated by the sensors having horizontal lines), as opposed to the diagonal sensors that are not activated (indicated by the sensors having vertical lines). FIG. 3A also illustrates a representation of the corresponding sixteen keys ($Keys_{1-16}$) associated with the unique combinations of row, column, and diagonal sensors at the respective locations on the capacitive-matrix keyboard 300. For example, the single touch 310 activates the sixth key ($Key_6$) (indicated by the double hashed lines). Similarly, when the single touch occurs at the top-left capacitive key 320, the first key ($Key_1$) is activated. Since each of the capacitive keys includes a unique combination, activation of each capacitive key touch may be detected, regardless of when the capacitive key is touched, as shown in FIGS. 3B and 3C.

Figure 3B:
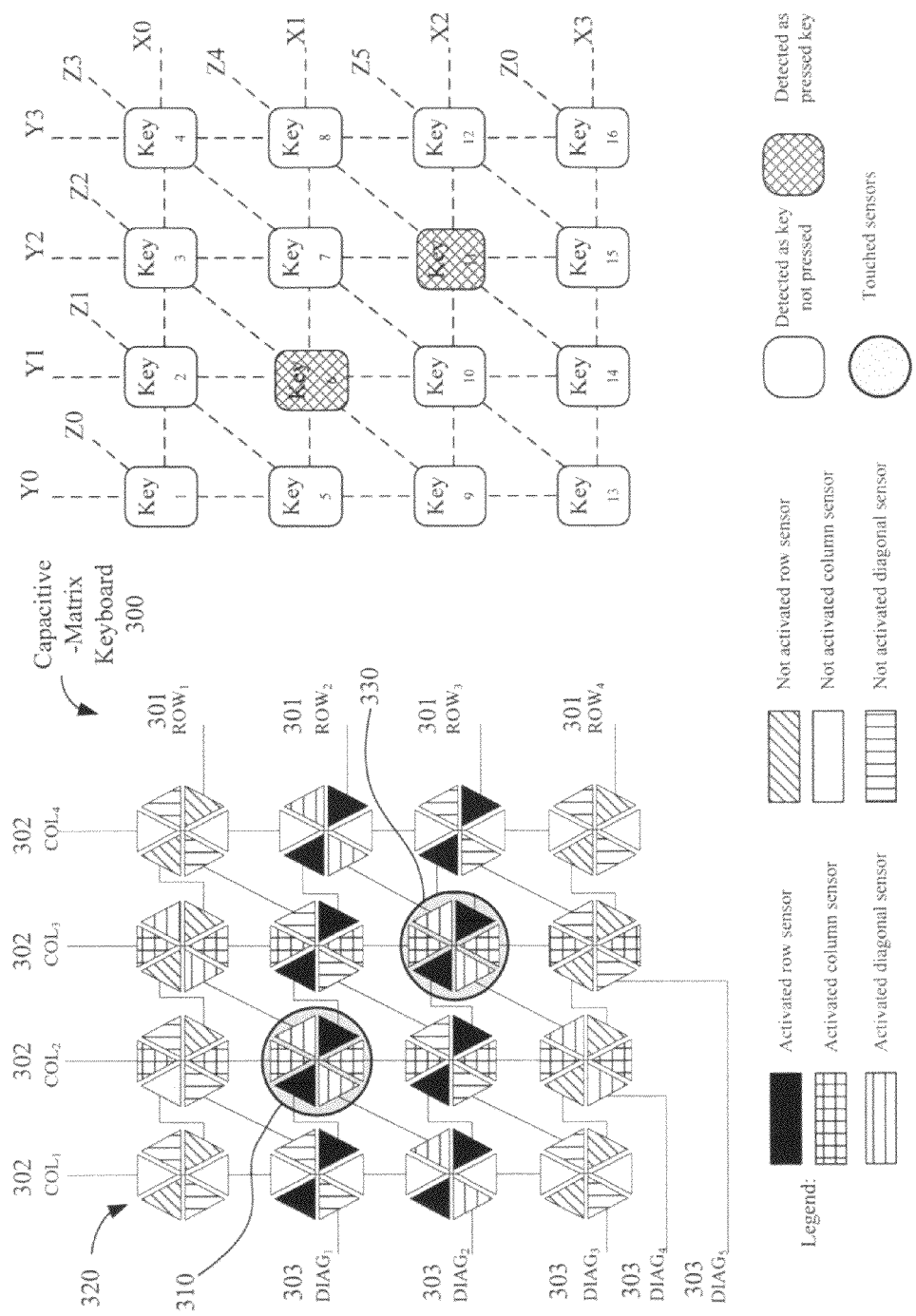
FIG. 3B illustrates an activation scenario of two substantially simultaneous touches on a capacitive-matrix keyboard according to one embodiment.
Figure 3C:
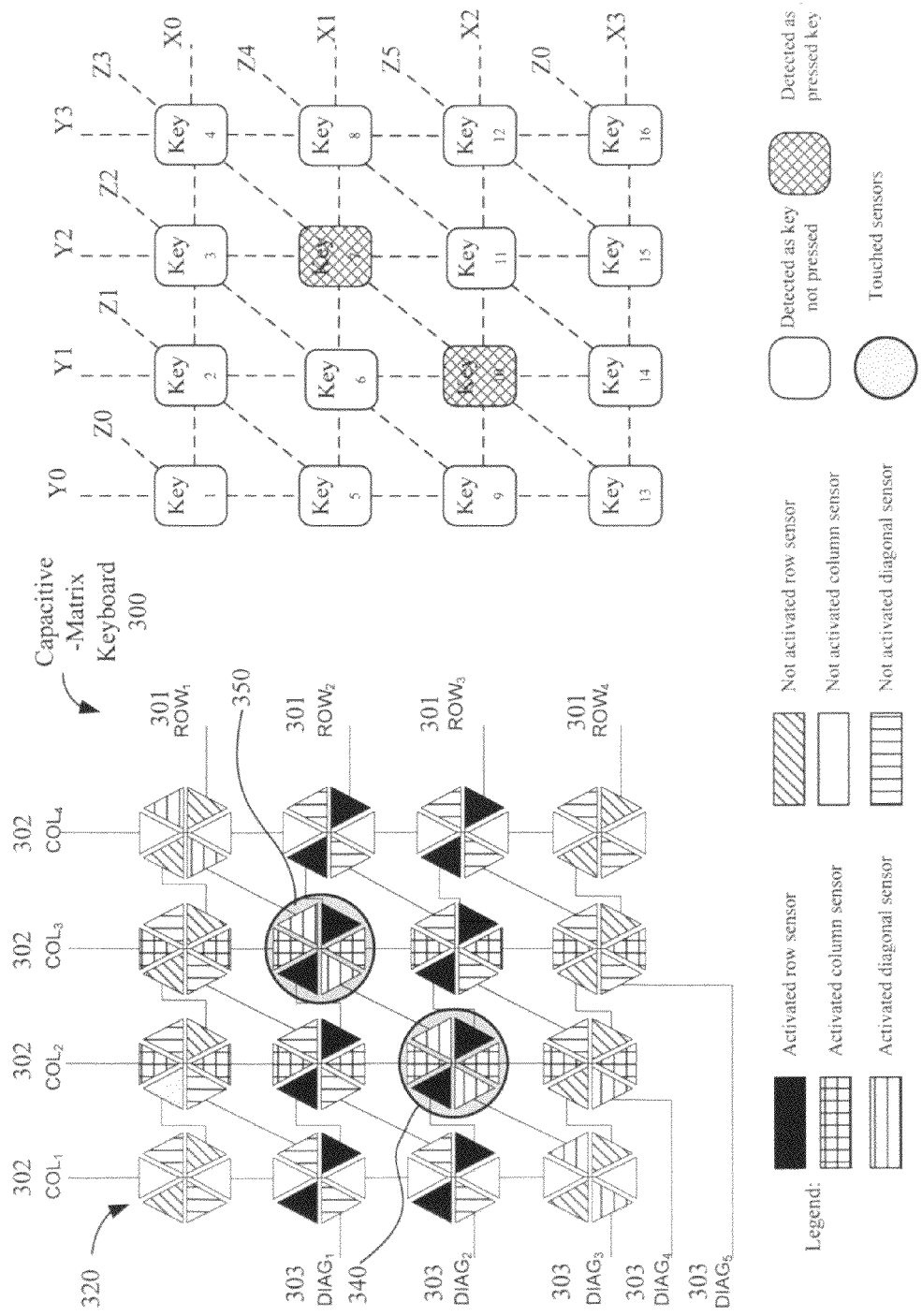
FIG. 3C illustrates another activation scenario of two substantially simultaneous touches on a capacitive-matrix keyboard according to one embodiment.

FIGS. 3B and 3C illustrate activation scenarios of two substantially simultaneous touches on the capacitive-matrix keyboard 300. In the scenario of FIG. 3B, two substantially simultaneous touches are detected on the capacitive-matrix keyboard; one touch 310 is detected on the second row ($ROW_2$) 301, the second column ($COL_2$), and the second diagonal ($DIAG_2$), as described above in FIG. 3A, and the other touch 330 is detected on the third row ($ROW_3$) 301, the third column ($COL_3$), and the fourth diagonal ($DIAG_4$). The touch 310 activates the sixth key ($Key_6$), and the touch 330 activates the eleventh key ($Key_{11}$). In the scenario of FIG. 3C, two substantially simultaneous touches are detected on the capacitive-matrix keyboard; one touch 340 is detected on the third row ($ROW_3$) 301, the second column ($COL_2$), and the third diagonal ($DIAG_3$), and the other touch 350 is detected on the second row ($ROW_2$) 301, the third column ($COL_3$), and the third diagonal ($DIAG_3$). The touch 340 activates the tenth key ($Key_{10}$), and the touch 350 activates the seventh key ($Key_7$). Since each of the capacitive keys 320 have a unique combination, the activation of the each of the capacitive keys 320 can be independently detected. This allows multiple substantially simultaneous touches to be detected on the capacitive-matrix keyboard 300 without invalid activations.

Using the conventional method, the activation state of the substantially simultaneous touches of the sixth ($Key_6$) and eleventh keys ($Key_{11}$) could not be distinguished from the activation state of the substantially simultaneous touches of the seventh and tenth keys ($Key_7$ and $Key_{10}$). However, using the capacitive-matrix keyboard 300, the processing device 210 can detect, and distinguish between, the activation state of the substantially simultaneous touches of the sixth ($Key_6$) and eleventh keys ($Key_{11}$), and the activation state of the seventh and tenth keys ($Key_7$ and $Key_{10}$) without any false activations.

Figure 1B:
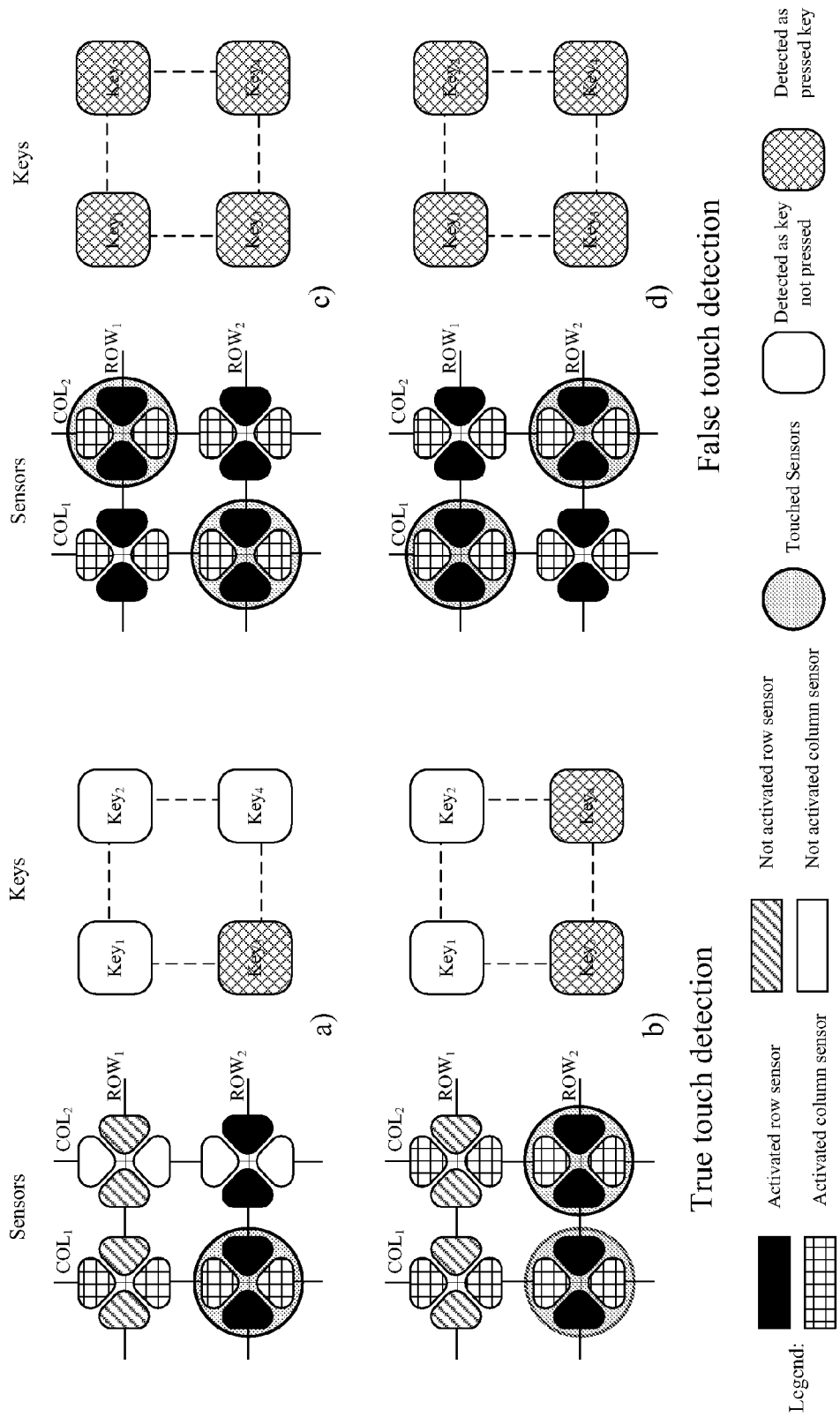
FIG. 1B illustrates multiple activation scenarios on a conventional keyboard matrix.

Unlike the conventional method, illustrated in the activation scenarios of FIG. 1B, the capacitive-matrix keyboard 300 works well, not only when one key is pressed at a time, as illustrated in FIG. 3A, but also when multiple keys (e.g., two or more) are pressed at substantially the same time, as illustrated in the exemplary scenarios of FIGS. 3B and 3C. Instead of detecting false activations (e.g., invalid activations) of the capacitive keys when more than one key is pressed, the processing device 210 can detect multiple valid activations when more than one key is pressed on the capacitive-matrix keyboard 300. The processing device 210 can detect simultaneous-key presses in any scenario, since each of the capacitive keys of the capacitive-matrix keyboard 300 have a unique combination of sensors from the three or more groups of sensor elements, unlike the conventional touch-sensor keyboard matrix, which cannot distinguish all activation states of the keyboard.

The layout pattern of the capacitive-matrix keyboard 300 may be disposed to maximize the area covered by conductive material, such as copper, Indium tin oxide (ITO), PEDOT (Poly(3,4-ethylenedioxythiophene)), PEDOT:PSS (Poly(3, 4-ethylenedioxythiophene) poly(styrenesulfonate)), or the like, in relation to spaces necessary to define the rows, columns, diagonals, or other axes of the capacitive-matrix keyboard 300.

Figures 4A, 4B:
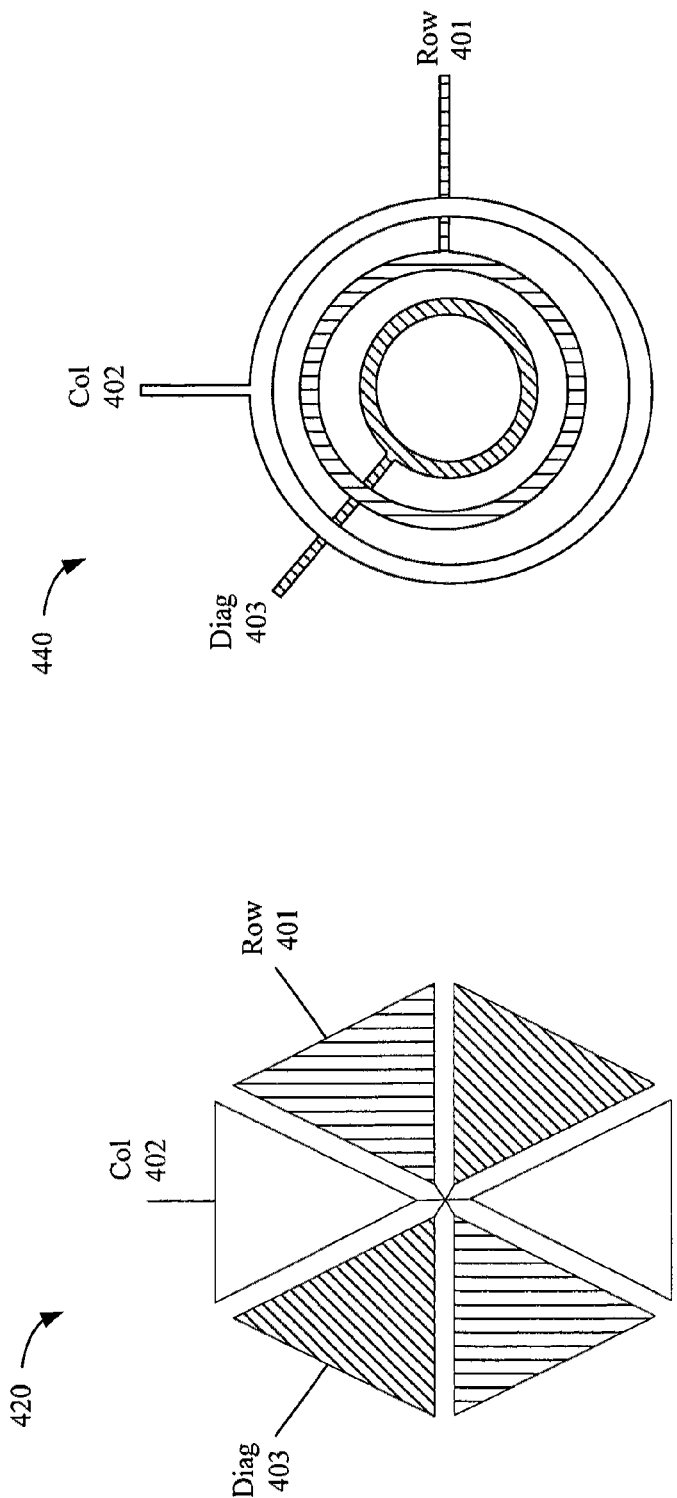
FIG. 4A illustrates one embodiment of three segments of a hexagon-shaped capacitive key.
FIG. 4B illustrates one embodiment of three segments of a circular-shaped capacitive key.

FIG. 4A illustrates one embodiment of three segments of a hexagon-shaped capacitive key 420. The hexagon-shaped capacitive key 420 includes a row segment 401, a column segment 402, and a diagonal segment 403. Each of the segments includes two connected triangle-shaped sensor elements that are oppositely disposed from one another. The six sensor elements of the capacitive key 420 collectively form a substantially hexagon shape. Although the embodiments of FIGS. 3A-3C and 4A described the three segments as being a hexagon shape of row, column, and diagonal segments, each having two triangle-shaped sensor elements oppositely disposed from one another, other shapes and configurations are possible. In one embodiment, the row, column, and diagonal segments each include tapered sensor elements that collectively form a substantially circular or oval shape. In another embodiment, the row, column, and diagonal segments each include interconnected linear traces that collectively form a substantially square or substantially rectangular shape. FIGS. 4B-4C illustrate three embodiments of different shaped segments and different shaped capacitive keys.

FIG. 4B illustrates one embodiment of three segments of a circular-shaped capacitive key 440. The circular-shaped capacitive key 440 includes a row segment 401, a column segment 402, and a diagonal segment 403. Each segment is a ring. Each of the ring-shaped segments may have different radii. The ring-shaped row segment 401 is disposed within the ring-shaped column segment 402, and the ring-shaped diagonal segment 403 is disposed within the ring-shaped row segment 401. Alternatively, other configurations of the ring segments are possible, such as the row segment 401 is within the column segment 402, which is within the diagonal segment 403, or the like. The three ring-shaped segments of the capacitive key 440 collectively form a substantially circular shape.

In these embodiments, all patterns may be built to satisfy a requirement that a finger should surely cover the three sensors (row, column, and diagonal segments) when touching the capacitive key. The pattern shown in FIGS. 4A and 4B may be used for comparatively small dimension sensors. When larger dimension sensors are used, there may be a sensor sensitivity reduction due to its large parasitic capacitance, and only some of the sensor segments may be active when the capacitive sensor is touched.

FIG. 4C illustrates one embodiment of three segments of a substantially square-shaped capacitive key 460. The substantially square-shaped capacitive key 460 includes a row segment 401, a column segment 402, and a diagonal segment 403. Each segment includes multiple interconnected traces. The interconnected traces of the three segments are interwoven, but electrically separate conductive traces. The interconnected traces of the capacitive key 460 collectively form a grid of a substantially square shape. Alternatively, the interconnected traces of the three segments may form other shapes, such as substantially-rectangular shapes, circular shapes, non-circular shapes, or other custom shapes to fit specific applications.

The pattern of FIG. 4C may be used for comparatively larger dimension sensors than those described with respect to FIGS. 4A and 4B, since it does not have the previous pattern's drawbacks.

Figure 4D:
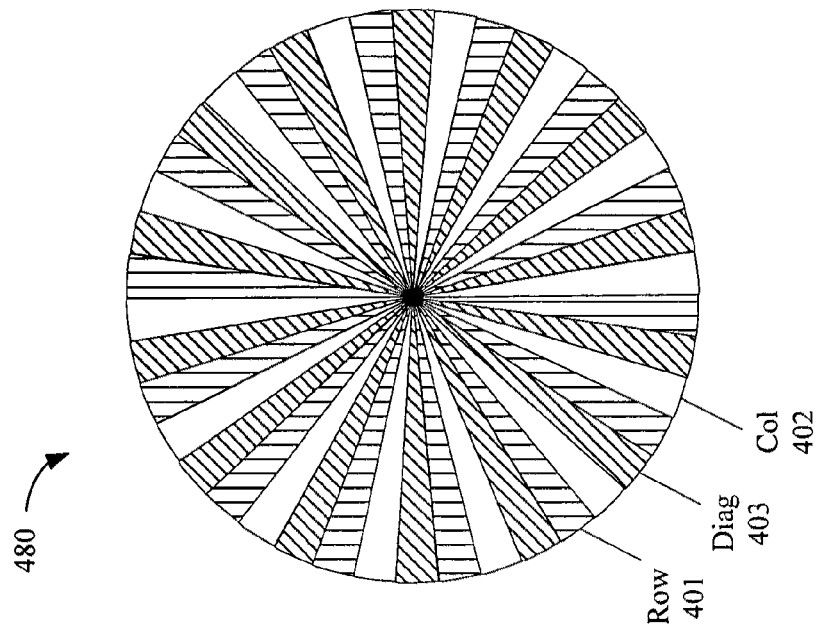
FIG. 4D illustrates one embodiment of three segments of a substantially circular-shaped capacitive key.
Figure 4C:
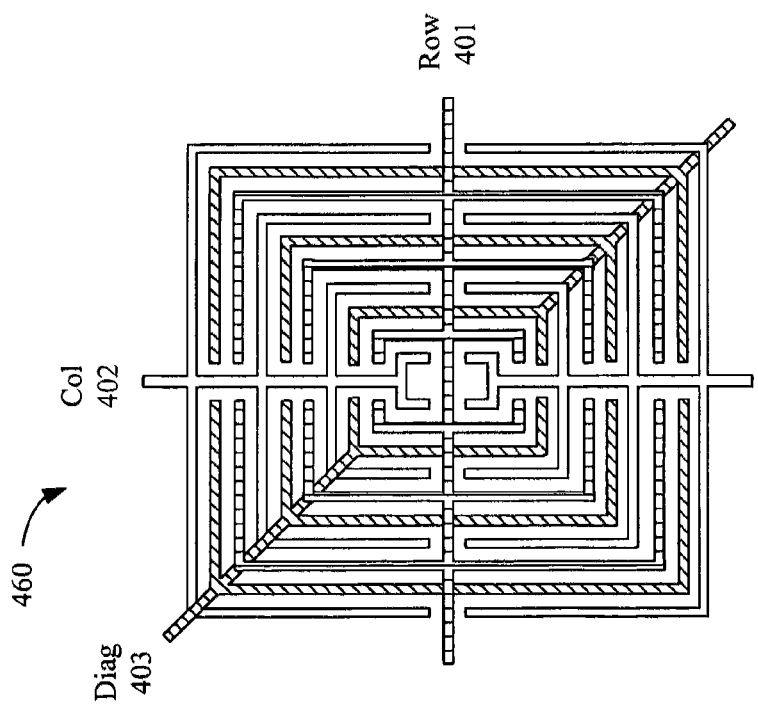
FIG. 4C illustrates one embodiment of three segments of a substantially square-shaped capacitive key.

FIG. 4D illustrates one embodiment of three segments of a substantially circular-shaped capacitive key 480. The substantially circular-shaped capacitive key 480 includes a row segment 401, a column segment 402, and a diagonal segment 403. Each segment includes multiple tapered sensor elements, or tapered conductive traces. The tapered sensor elements of the three segments are interwoven, but remain electrically separate from one another. The tapered sensor elements of the capacitive key 480 collectively form a substantially circular shape. Alternatively, the tapered sensor elements of the three segments may form other shapes, such as substantially oval shapes, or the like.

It should be noted that although row, column, and diagonal segments have been used to describe the capacitive keys, in other embodiments, the capacitive keys may include unique combinations of three or more segments of one or more sensor elements from three or more separate groups of sensor elements. In one embodiment, the three or more groups of sensor elements each include one or more lines of interconnected, tessellated shapes.

It should also be noted that although the embodiments of FIGS. 3A-3C are described as being part of a capacitive-matrix keyboard 300, in other embodiments, the capacitive keys having unique combinations of sensor elements from three or more separate sensor groups may be implemented in other touch-sensor devices. For example, the capacitive keys may be used in a keypad, a touch-panel having one or more buttons, a touchscreen, or the like.

The operations of this and other flow diagrams will be described with reference to the exemplary embodiments of the other diagrams. However, it should be understood that the operations of the flow diagrams can be performed by embodiments of the invention other than those discussed with reference to these other diagrams, and the embodiments of the invention discussed with reference these other diagrams can perform operations different than those discussed with reference to the flow diagrams.

The techniques shown in the figures can be implemented using code and data stored and executed on one or more computers. Such computers store and communicate (internally and with other computers over a network) code and data using machine-readable media, such as machine storage media (e.g., magnetic disks; optical disks; random access memory; read only memory; flash memory devices) and machine communication media (e.g., electrical, optical, acoustical or other form of propagated signals—such as carrier waves, infrared signals, digital signals, etc.). In addition, such computers typically include a set of one or more processors coupled to one or more other components, such as a storage device, a number of user input/output devices (e.g., a keyboard and a display), and a network connection. The coupling of the set of processors and other components is typically through one or more busses and bridges (also termed as bus controllers). The storage device and network traffic respectively represent one or more machine storage media and machine communication media. Thus, the storage device of a given computer system typically stores code and data for execution on the set of one or more processors of that computer. Of course, one or more parts of an embodiment of the invention may be implemented using different combinations of software, firmware, and/or hardware.

Figure 5:
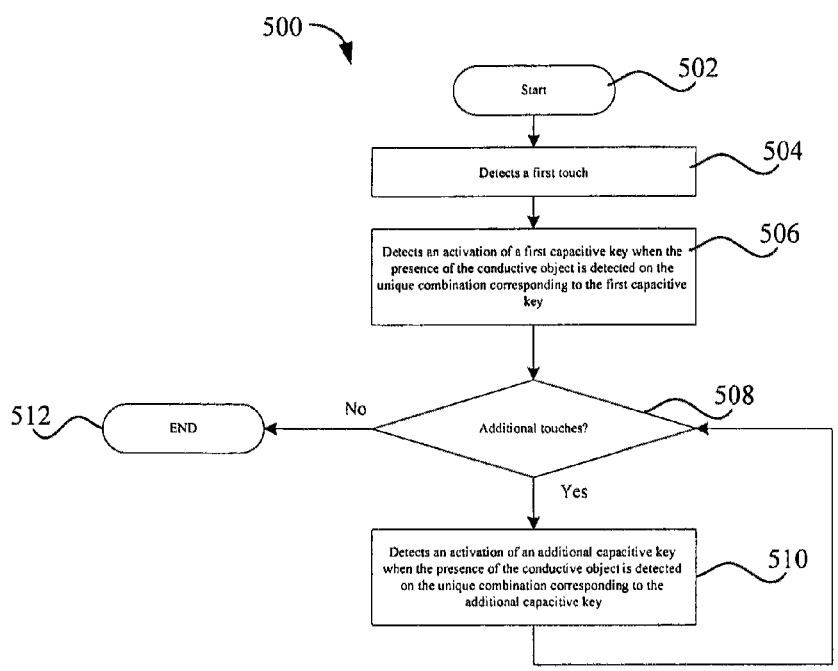
FIG. 5 is a flow diagram of one embodiment of a method 500 for detecting one or more activations of one or more capacitive keys when one or more touches are detected on the capacitive-matrix keyboard.

FIG. 5 is a flow diagram of one embodiment of a method 500 for detecting one or more activations of one or more capacitive keys when one or more touches are detected on the capacitive-matrix keyboard. The method 500 is performed by processing logic that may include hardware (circuitry, dedicated logic, or the like), software (such as is run on a general-purpose computer system or a dedicated machine), or a combination of both. In one embodiment, method 500 is performed by the processing device 210.

Processing logic starts (block 502) and detects a first touch by detecting the presence of a conductive object on touch-sensor device (e.g., capacitive-matrix keyboard 300) which has multiple capacitive keys each having a unique combination of sensor elements from three or more separate groups of one or more sensor elements (block 504). The processing logic detects an activation of a first capacitive key when.the presence of the conductive object is detected on the unique combination correspond to the first capacitive key (block 506). The processing logic determines if there are additional touches detected on the touch-sensor device (block 508). If an additional touch is detected, the processing logic detects an activation of an additional capacitive key when the presence of the conductive object (additional conductive object) is detected on the unique combination corresponding to the additional capacitive key (block 510). Otherwise, the processing logic ends (block 512). The first touch and the additional touch may be substantially simultaneous touches.

In one embodiment, the method detects the activation of the first capacitive key by detecting the presence of the conductive object on a first sensor element of a first group of one or more sensor elements, on a second sensor element of a second group of one or more sensor elements, and on a third sensor element of a third group of sensor elements. As described above with respect to FIG. 3, the first, second, and third group of sensor elements may be rows, columns, and diagonals, and the unique combination may be a unique combination of row, column, and diagonal segments corresponding to each of the capacitive keys. The unique combination of three or more segments for each capacitive key may be used to independently detect an activation of the capacitive key, as well as multiple activations of multiple capacitive keys when multiple capacitive keys are touched at the same time.

In one embodiment, the first, second, and third groups of sensor elements includes multiple diagonals, rows, and columns of sensor elements, respectively. The method detects the activation of the first capacitive key by scanning the diagonals, rows, and columns to detect the presence on one of the diagonals, on one of the rows, and on one of the columns. The activation of the first capacitive key is detected when the presence of the conductive object is detected on the unique combination of the row, column, and diagonal on which the presence of the conductive object is detected. The unique combination at the intersection of the row, column, and diagonal corresponds to the first capacitive key. When multiple substantially simultaneous touches are detected on the touch-sensor device, the method scans the diagonals, rows, and columns to detect the presences of the substantially simultaneous touches on the diagonals, on the rows, and on the columns. The activations of the multiple capacitive key are detected when the presences of the conductive object are detected on the unique combinations at the intersecting locations respective locations of the rows, column, and diagonals on which the plurality of substantially simultaneous touches are detected. The detected unique combinations correspond to the activated capacitive keys.

In another embodiment, the method determines which of the diagonals has detected at least one of the substantially simultaneous touches. For each of the diagonals that detects at least one of the substantially simultaneous touches, determines which of the rows detects at least one of the substantially simultaneous touches, and determines which of the columns detects at least one of the substantially simultaneous touches, and determines that unique combination of the respective locations of the compact of trees on which the substantially simultaneous touches are detected based on the determinations of which the diagonals, rose, and columns has detected at least one of the substantially simultaneous touches. Each determined unique combination corresponds to one of the activated capacitive keys.

In another embodiment, the method detects multiple activations by scanning each of the three or more separate groups to detect presences of multiple substantially simultaneous touches on touch-sensor device, and many intersections of the detect presences on the unique combinations of the three or more sensor elements from each of the three or more separate groups to detect the multiple activations.

Figure 6:
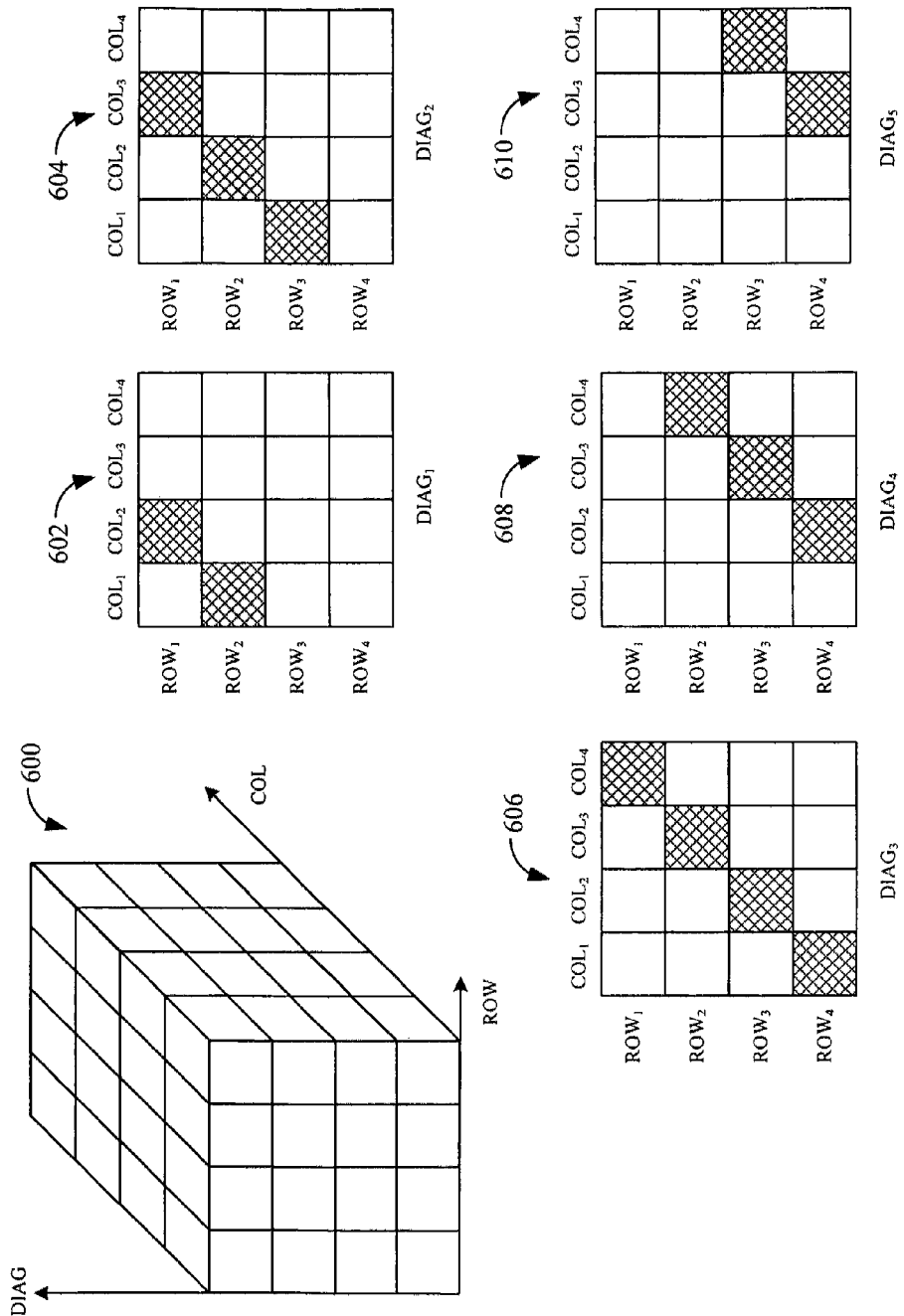
FIG. 6 illustrates a three-dimensional (3D) array with unique key combinations and the corresponding two-dimensional row-column arrays according to one embodiment.

FIG. 6 illustrates a 3D array 600 with unique key combinations and the corresponding two-dimensional row-column arrays 602-610 according to one embodiment. As described above, one or more touches may be detected by analyzing the row, column, and diagonal segment intersections as described below with respect to FIG. 7. Each intersection represents a unique combination of segments of three or more groups. The embodiments of the capacitive-matrix keyboard with three group segments can be represented as the three-dimensional (3D) array 600 with unique key combinations (e.g., intersections) in each row-column two-dimensional arrays 602-610. In particular, the row-column array 602 for the first diagonal (DIAG$_1$) 303 illustrates that if the first diagonal 303 is detected then the unique combinations are limited to the two intersections at the first row (ROW$_1$) 301 and the second column (COL$_2$) 302, and at the second row (ROW$_2$) 301 and the first column (COL$_1$) 302. Similarly, the row-column arrays 604-610 include the possible unique combinations (e.g., possible intersections). If any diagonal line is activated the search algorithm analyzes the row and column lines to find the touched keys at the possible intersections. The key is considered to be "touched," when the row and column lines are activated in the same time frame (e.g., scanning cycle) as the diagonal line.

Figure 7:
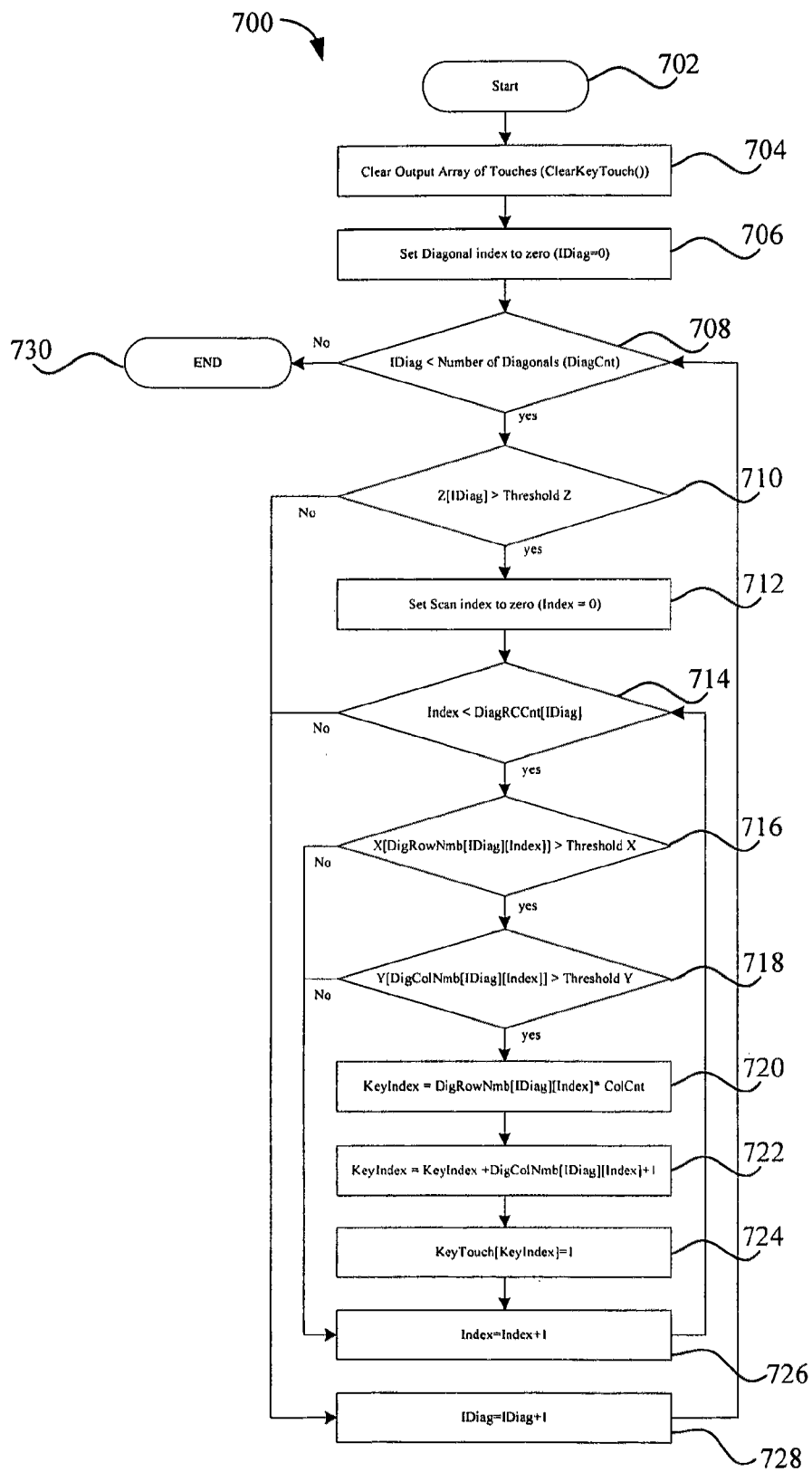
FIG. 7 is a flow diagram of another embodiment of a method 700 for detecting one or more activations of one or more capacitive keys when one or more touches are detected on the capacitive-matrix keyboard.

FIG. 7 is a flow diagram of another embodiment of a method 700 for detecting one or more activations of one or more capacitive keys when one or more touches are detected on the capacitive-matrix keyboard. The method 700 is performed by processing logic that may include hardware (circuitry, dedicated logic, or the like), software (such as is run on a general-purpose computer system or a dedicated machine), or a combination of both. In one embodiment, method 600 is performed by the processing device 210.

Processing logic starts (block 702) and sets the elements of the output array to zero (ClearKeyTouch( )). Each element represents each capacitive key to zero (block 704). If the capacitive key is pressed the corresponding element in the output array is set to "1," and when not pressed is set to "0." The array cell number may correspond to the number of the capacitive key. Table 1-1 includes an exemplary output array (KeyTouch) when the capacitive keys have all been set to zero for a 4×4 capacitive-matrix keyboard having sixteen capacitive keys, as illustrated in FIGS. 3A-3C.

TABLE 1-1

| | # | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Value | 0 | 0 | 0 | 0 | 0 | 0 | 0 | 0 | 0 | 0 | 0 | 0 | 0 | 0 | 0 | 0 |

Once the processing logic sets the elements to zero, the processing logic sets the diagonal index to zero (block 706) and determines if the diagonal index is less than the total number of diagonals (IDiag<DiagCnt) (block 708). When the diagonal index is less than the total number of diagonals, the processing logic scans the current diagonal to determine if the capacitance on the current diagonal is greater than the capacitance threshold for diagonals (Z[IDiag]>Threshold Z) (block 710), otherwise, the process ends (block 730). For ease of discussion, the description below is based on two substantially simultaneous touches being detected on the sixth and eleventh keys (Key$_6$ and Key$_{11}$); however, other combinations of one or more touches may be detected. When the capacitance is greater than the threshold for the current diagonal at block 710, the current diagonal is found to have detected a touch, or rather, the processing logic has detected the presence of a conductive object on the current diagonal, and the processing logic analyzes the row and columns to find the touched keys, as described at blocks 712-726. However, if the capacitance is not greater than the threshold for the current diagonal at block 710, the processing logic increments the diagonal index (block 728) to set the next diagonal as the current diagonal, and returns to block 708. In effect, the loop continues until the processing logic detects the presence of a conductive object on one of the diagonals before scanning the rows and columns. In this embodiment, the third and fifth diagonals are activated. Table 1-2 includes an exemplary activation state array for the diagonals (Z) according to one embodiment.

TABLE 1-2

| Z0 | Z1 | Z2 | Z3 | Z4 | Z5 |
|---|---|---|---|---|---|
| 0 | 0 | 1 | 0 | 1 | 0 |

At block 712, the processing logic sets the scan index to zero (block 712) (Index=0), and determines if the current index value is less than the total number of intersections (DiagRCCnt[IDiag]) of the columns and rows with the current diagonal (block 714). The total number of intersections for each of the diagonals may be stored in an array. The processing logic then determines which of the possible combinations of rows has been touched (block 716) and determines which of the possible combinations of columns has been touched (block 718). When the current row has not been touched, the processing logic increments the scan index (Index=Index+1) (block 726), setting the next row to the current row, and the processing logic returns to block 714. Similarly, when the current column has not been touched, the processing logic increments the scan index at block 726, and returns to block 714. In this embodiment, the second and third rows (ROW$_2$ or ROW$_3$) have been touched, and the second and third columns (COL2 and COL3) have been touched. Table 1-3 includes an exemplary activation state array for the rows (X) according to one embodiment.

TABLE 1-3

| X0 | X1 | X2 | X3 |
|----|----|----|----|
| 0  | 1  | 1  | 0  |

Table 1-4 includes an exemplary activation state array for the columns (Y) according to one embodiment.

TABLE 1-4

| Y0 | Y1 | Y2 | Y3 |
|----|----|----|----|
| 0  | 1  | 1  | 0  |

Based on the activated diagonals, rows, and columns, the processing logic determines which capacitive key has been pressed based on the unique combinations of activated diagonals, rows, and columns. The processing logic determines the particular key that has been activated to set the corresponding element in the output array (KeyTouch), by setting the key index equal to the current activated row by the total number of columns (block 720) (KeyIndex=DigRowNmb[IDiag][Index]*ColCnt), and adds the current activated column and adding 1 to get the key index for keys 1-16, instead of keys 0-15 (block 722) (KeyIndex=KeyIndex+DigColNmb[IDiag][Index]+1). The element of the output array, as represented by the determined key index, is set to "1" to represent that the particular capacitive key has been activated. The processing logic continues at block 726 to increment the scan index by one, and returns to block 714 for the next activated diagonal. In this embodiment, the sixth and eleventh capacitive keys (Key$_6$ and Key$_{11}$) have been activated (e.g., KeyIndex=1*4+1+1=6 (Key$_6$) and KeyIndex=2*4+2+1=11 (Key$_{11}$)). Table 1-5 includes an exemplary output array (KeyTouch) illustrating that the sixth and eleventh capacitive keys (Key$_6$ and Key$_{11}$) have been activated, as illustrated in FIG. 3B.

TABLE 1-5

| # | | | | | | | | | | | | | | | |
|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 |

| Value | | | | | | | | | | | | | | | |
|---|---|---|---|---|---|---|---|---|---|---|---|---|---|---|---|
| 0 | 0 | 0 | 0 | 0 | 1 | 0 | 0 | 0 | 0 | 1 | 0 | 0 | 0 | 0 | 0 |

In this particular embodiment where activations of the sixth and eleventh keys (Key$_6$ and Key$_{11}$) have been detected, the operations of the pressed-key detection algorithm may be as follows:

1. Set all output array elements to "0"
2. Z0 diagonal is not active (move to the next diagonal)
3. Z1 diagonal is not active (move to the next diagonal)
4. Z2 is active (move to pressed key definition)
   a. X0 row is not active (move to the next row)
   b. X1 row is active (move to Y1 column analysis)
   c. Y1 column is active (the Key$_6$ is pressed and "1" is put down into the 6$^{th}$ element of the output array)
   d. X2 row is not active (move to the next diagonal)
5. Z3 diagonal is not active (move to the next diagonal)
6. Z4 diagonal is active (move to the pressed key definition)
   a. X1 row is active (move to Y3 column analysis)
   b. Y3 column is not active (move to X2 row analysis)
   c. X2 row is active (move to Y2 column analysis)
   d. Y2 column is active (the Key$_{11}$ is pressed and "1" is put down into the 11$^{th}$ element of output array)
   e. X2 row is not active (move to the next diagonal)
7. Z5 diagonal is not active (pressed-key detection algorithm is completed)

Alternatively, the operations of the pressed-key detection algorithms may vary depending on the particular combinations of pressed keys are detected.

Embodiments of the present invention, described herein, include various operations. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may be a machine-readable storage medium or a machine-readable transmission medium. The machine-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions. The machine-readable transmission medium may include, but is not limited to, electrical, optical, acoustical, or other form of propagated signal (e.g., carrier waves, infrared signals, digital signals, etc.); or another type of medium suitable for transmitting electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 210 may also be done in the host. In another embodiment, the processing device 210 is the host. Embodiments of the method and apparatus described herein may be implemented in a fully self-contained capacitive-matrix keyboard, which outputs fully processed data signals or data commands to a host. The method and apparatus may also be implemented in a capacitive-matrix keyboard which outputs raw capacitance data to a host, where the host processes the capacitance data. Alternatively, the method and apparatus may be implemented in a capacitive-matrix keyboard, which outputs pre-processed capacitance data to a host.

The electronic system that includes the embodiments described herein may be implemented in a wired or wireless keyboard, which is itself connected to a host. Alternatively, the embodiments described herein may be implemented in a transparent touch screen. Alternatively, the embodiments may be implemented in a mobile handset (e.g., cellular or mobile phone) or other electronic devices, such as a personal data assistant (PDA), a kiosk, a keyboard, a television, a remote control, a monitor, a handheld multi-media device, a handheld video player, a handheld gaming device, or a control panel.

It should be noted that the embodiments described herein may be implemented in other sensing technologies than capacitive sensing, such as optical imaging, mechanical, optical, and other sensing technologies which allows detecting the touch possibility. Regardless sensing technique used for the touch signal detection, the high-level key detection algorithm, may remain virtually unchanged. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.), hand-writing recognition, and numeric keypad operations.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
   detecting a presence of a conductive object on a touch-sensor device having a plurality of capacitive keys at respective locations on the touch-sensor device, wherein each of the plurality of capacitive keys comprises a unique combination of three or more sensor elements from three or more separate groups of one or more sensor elements; and
   detecting activation of a first capacitive key of the plurality of capacitive keys when the presence of the conductive object is detected on the unique combination of three or more sensor elements corresponding to the first capacitive key, wherein the first capacitive key comprises:
   a first ring-shaped segment of a first group of the three or more separate groups,
   a second ring-shaped segment of a second group of the three or more separate groups disposed within the ring of the first ring-shaped segment; and
   a third ring-shaped segment of a third group of the three or more separate groups disposed within the ring of the second ring-shaped segment.

2. The method of claim 1, wherein detecting the activation of the first capacitive key comprises:
   detecting the presence of the conductive object on a first sensor element of a first group of the three or more separate groups;
   detecting the presence of the conductive object on a second sensor element of a second group of the three or more separate groups; and
   detecting the presence of the conductive object on a third sensor element of a third group of the three or more separate groups, wherein the first, second, and third sensor elements correspond to the unique combination of the first capacitive key.

3. The method of claim 1, wherein a first group of sensor elements comprises a plurality of diagonals of sensor elements, a second group of sensor elements comprises a plurality of rows of sensor elements, and a third group of sensor elements comprises a plurality of columns of sensor elements, and wherein detecting the activation of the first capacitive key comprises:
   scanning the plurality of diagonals to detect the presence of the conductive object on one of the plurality of diagonals;
   scanning the plurality of rows to detect the presence of the conductive object on one of the plurality of diagonals; and
   scanning the plurality of columns to detect the presence of the conductive object on one of the plurality of diagonals, wherein the activation of the first capacitive key is detected when the presence of the conductive object is detected on the unique combination at the intersecting location of the row, column, and diagonal on which the presence of the conductive object is detected, and wherein the unique combination corresponding to the first capacitive key.

4. The method of claim 1, further comprising:
   detecting presences of a plurality of substantially simultaneous touches on the touch-sensor device; and
   detecting a plurality of activations of the plurality of capacitive keys when the presences of the plurality of substantially simultaneous touches are detected on the unique combinations of three or more sensor elements at the respective locations of the capacitive keys on which the plurality of substantially simultaneous touches are detected.

5. The method of claim 4, wherein a first group of sensor elements comprises a plurality of diagonals of sensor elements, a second group of sensor elements comprises a plurality of rows of sensor elements, and a third group of sensor elements comprises a plurality of columns of sensor elements, and wherein detecting the plurality of activations comprises:
   scanning the plurality of diagonals to detect the presences of the plurality of substantially simultaneous touches on the plurality of diagonals;
   scanning the plurality of rows to detect the presences of the plurality of substantially simultaneous touches on the plurality of diagonals; and
   scanning the plurality of columns to detect the presences of the plurality of substantially simultaneous touches on the plurality of diagonals, wherein the plurality of activations of the plurality of substantially simultaneous touches are detected when the presences of the plurality of substantially simultaneous touches are detected on the unique combinations at the respective intersecting locations of the plurality of diagonals, rows, and columns on which the plurality of substantially simultaneous touches are detected, and wherein the detected unique combinations correspond to the activated capacitive keys.

6. The method of claim 4, wherein a first group of sensor elements comprises a plurality of diagonals of sensor elements, a second group of sensor elements comprises a plurality of rows of sensor elements, and a third group of sensor elements comprises a plurality of columns of sensor elements, and wherein detecting the plurality of activations comprises:

determining which of the plurality of diagonals detects at least one of the plurality of substantially simultaneous touches; and for each of the plurality of diagonals that detects at least one of the plurality of substantially simultaneous touches, performing the following:

determining which of the plurality of rows detects at least one of the plurality of substantially simultaneous touches;

determining which of the plurality of columns detects at least one of the plurality of substantially simultaneous touches, wherein the intersections of where the plurality of substantially simultaneous touches; and determining the unique combination at the respective locations of the capacitive keys on which the plurality of substantially simultaneous touches are detected based the determinations of which of the plurality of diagonals, rows, and columns has detected at least one of the plurality of substantially simultaneous touches, wherein each determined unique combination corresponds to one of the activated capacitive keys.

7. The method of claim 4, wherein detecting the plurality of activations comprises:

scanning each of the three or more separate groups to detect the presences of the plurality of substantially simultaneous touches on the touch-sensor device; and determining intersections of the detected presences on the unique combinations of the three or more sensor elements from each of the three or more separate groups to detect the plurality of activations.

8. An apparatus, comprising a processing device to detect a presence of a conductive object on a touch-sensor device having a plurality of capacitive keys at respective locations on the touch-sensor device, wherein each of the plurality of capacitive keys comprises a unique combination of three or more sensor elements from three or more separate groups of one or more sensor elements, and wherein the processing device is configured to detect activation of a first capacitive key of the plurality of capacitive keys when the presence of the conductive object is detected on the unique combination of three or more sensor elements corresponding to the first capacitive key, wherein the first capacitive key comprises:

a first ring-shaped segment of a first group of the three or more separate groups, a second ring-shaped segment of a second group of the three or more separate groups disposed within the ring of the first ring-shaped segment; and a third ring-shaped segment of a third group of the three or more separate groups disposed within the ring of the second ring-shaped segment.

9. The apparatus of claim 8, further comprising the touch-sensor device having the plurality of capacitive keys, wherein the unique combination of three or more sensor elements for each of the plurality of capacitive keys is separately coupled to the processing device.

10. The apparatus of claim 9, wherein the processing device is further configured to detect presences of a plurality of substantially simultaneous touches on the touch-sensor device.

11. An apparatus, comprising:

a touch-sensor device having a plurality of capacitive keys, wherein each capacitive key comprises a unique combination of three or more sensor elements from three or more separate groups of one or more sensor elements, wherein at least one of the capacitive keys comprise a first ring-shaped segment of a first group of the three or more separate groups, a second ring-shaped segment of a second group of the three or more separate groups disposed within the ring of the first ring-shaped segment, and a third ring-shaped segment of a third group of the three or more separate groups disposed within the ring of the second ring-shaped segment; and means for detecting a plurality of activations of the plurality of capacitive keys when presences of a plurality of substantially simultaneous touches are detected using the unique combinations of the plurality of substantially simultaneous touches.

\* \* \* \* \*